United States Patent
Nakahira et al.

(10) Patent No.: US 11,088,662 B2
(45) Date of Patent: Aug. 10, 2021

(54) DIGITAL AMPLIFIER AND OUTPUT DEVICE

(71) Applicant: SHARP KABUSHIKI KAISHA, Sakai (JP)

(72) Inventors: Tsuyoshi Nakahira, Kobe (JP); Akihiro Nishigaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 44 days.

(21) Appl. No.: 16/627,497

(22) PCT Filed: Jun. 20, 2018

(86) PCT No.: PCT/JP2018/023505
§ 371 (c)(1),
(2) Date: Dec. 30, 2019

(87) PCT Pub. No.: WO2019/012934
PCT Pub. Date: Jan. 17, 2019

(65) Prior Publication Data
US 2020/0153396 A1    May 14, 2020

(30) Foreign Application Priority Data

Jul. 13, 2017 (JP) .............................. JP2017-137355

(51) Int. Cl.
*H03F 3/36* (2006.01)
*H03F 3/217* (2006.01)
(Continued)

(52) U.S. Cl.
CPC .............. *H03F 3/217* (2013.01); *H03F 3/50* (2013.01); *H03F 3/68* (2013.01); *H03H 11/126* (2013.01);
(Continued)

(58) Field of Classification Search
CPC ... H03F 3/217; H03F 3/50; H03F 3/68; H03F 3/181; H03F 2200/03; H03F 3/2175;
(Continued)

(56) References Cited

U.S. PATENT DOCUMENTS 7,312,654 B2 * 12/2007 Roeckner ................ H03F 1/305
330/10
8,228,117 B2 * 7/2012 Midya .................... H03G 3/348
330/10
(Continued)

FOREIGN PATENT DOCUMENTS

JP    2000-295049 A    10/2000
JP    2001-332939 A    11/2001
(Continued)

*Primary Examiner* — Khanh V Nguyen
(74) *Attorney, Agent, or Firm* — ScienBiziP, P.C.

(57) ABSTRACT

A digital amplifier that minimizes and restricts an analog signal system and uses a feedback signal and a dither signal is achieved. A pulse width modulator that adjusts a pulse width of a digital signal, a switching circuit that amplifies an output signal from the pulse width modulator, and a feedback signal generation unit that generates a feedback signal based on an output signal from the switching circuit are included, the pulse width modulator adjusts the pulse width of the digital signal with reference to the feedback signal, and the feedback signal generation unit includes a first amplifier that outputs a first amplified signal in which a difference between the output signal from the switching circuit and one of a reference voltage and a dither signal is amplified and a second amplifier that amplifies a difference between the first amplified signal and the other of the dither signal and the reference voltage and outputs the amplified difference as the feedback signal.

9 Claims, 4 Drawing Sheets

(51) Int. Cl.
  *H03F 3/50*    (2006.01)
  *H03F 3/68*    (2006.01)
  *H03H 11/12*   (2006.01)
  *H03K 7/08*    (2006.01)
  *H03M 1/06*    (2006.01)

(52) U.S. Cl.
  CPC ............ *H03K 7/08* (2013.01); *H03M 1/0639* (2013.01); *H03F 3/2171* (2013.01); *H03F 3/2173* (2013.01)

(58) Field of Classification Search
  CPC ........ H03F 3/2173; H03F 3/38; H03F 3/2171; H03F 2200/351; H03H 11/126; H03K 7/08; H03M 1/0639
  USPC ...................... 330/10, 251; 381/121; 375/238
  See application file for complete search history.

(56) References Cited

U.S. PATENT DOCUMENTS

| | | | |
|---|---|---|---|
| 8,975,956 B2 * | 3/2015 | Sugawara | ............. H03F 1/0222 330/10 |
| 2001/0043152 A1 | 11/2001 | Kishida | |

FOREIGN PATENT DOCUMENTS

| | | |
|---|---|---|
| JP | 2007-005957 A | 1/2007 |
| JP | 2010-268211 A | 11/2010 |

* cited by examiner

DIGITAL AMPLIFIER AND OUTPUT DEVICE

TECHNICAL FIELD

An aspect of the disclosure relates to a digital amplifier whose input signal is a digital signal and an output device using the digital amplifier.

BACKGROUND ART

Conventionally, a digital audio reproduction system includes a DA converter (quantizer) and a digital signal system and an analog signal system are mixed.

For example, PTL 1 describes a digital amplifier that adds an output of a switching circuit and an output of an LC filter, which receives the output of the switching circuit, and inputs a result of the addition to an LPF in a feedback loop.

Moreover, PTL 2 describes a digital switching amplifier that attenuates respective 1-bit signals subjected to delta sigma modulation and adds adjustment voltages so that a DC voltage level difference between negative feedback signals which return to a delta sigma modulation circuit becomes zero.

Moreover, PTL 3 describes a digital switching amplifier including a voltage reduction unit that generates a feedback signal in a feedback loop, which is used for feedback of a switching signal to a digital sigma modulation unit, by voltage reduction in the switching signal through resistance division.

Moreover, PTL 4 describes a signal correction device that adjusts a pulse width on the basis of a feedback signal based on an output signal from a switching circuit that amplifies an output signal from a pulse width adjustment circuit.

CITATION LIST

Patent Literature

PTL 1: Japanese Unexamined Patent Application Publication No. 2007-5957 (published on Jan. 11, 2007)
PTL 2: Japanese Unexamined Patent Application Publication No. 2001-332939 (published on Nov. 30, 2001)
PTL 3: Japanese Unexamined Patent Application Publication No. 2000-295049 (published on Oct. 20, 2000)
PTL 4: Japanese Unexamined Patent Application Publication No. 2010-268211 (published on Nov. 25, 2010)

SUMMARY

Technical Problem

As described above, in techniques described in PTLs 1 to 4, the digital signal system and the analog signal system are mixed. On the other hand, the digital audio reproduction system with only the digital signal system is able to reproduce sound more faithful to the original sound, but is difficult to use a feedback signal or a dither signal and is thus limited in performance of noise characteristics or the like.

The disclosure is made in view of the aforementioned problem and an object thereof is to provide a technique that achieves a digital amplifier that minimizes and restricts an analog signal system and uses a feedback signal and a dither signal.

Solution to Problem

In order to solve the aforementioned problem, a digital amplifier according to an aspect of the disclosure includes: a pulse width adjustment circuit that adjusts a pulse width of a digital signal; a switching circuit that amplifies an output signal from the pulse width adjustment circuit; and a feedback signal generation unit that generates a feedback signal based on an output signal from the switching circuit, in which the pulse width adjustment circuit adjusts the pulse width of the digital signal with reference to the feedback signal, and the feedback signal generation unit includes a first amplifier that outputs a first amplified signal in which a difference between the output signal from the switching circuit and one of a reference voltage and a dither signal is amplified, and a second amplifier that amplifies a difference between the first amplified signal and the other of the dither signal and the reference voltage and outputs the amplified difference as the feedback signal.

In order to solve the aforementioned problem, an output device according to an aspect of the disclosure includes: a first digital amplifier that amplifies a first digital signal; and a second digital amplifier that amplifies a second digital signal having a phase opposite to a phase of the first digital signal, in which the first digital amplifier includes a first pulse width adjustment circuit that adjusts a pulse width of the first digital signal, a first switching circuit that amplifies an output signal from the first pulse width adjustment circuit, and a first feedback signal generation unit that generates a first feedback signal based on an output signal from the first switching circuit, the first pulse width adjustment circuit adjusts the pulse width of the first digital signal with reference to the first feedback signal, and the first feedback signal generation unit includes a first amplifier that outputs a first amplified signal in which a difference between the output signal from the first switching circuit and one of a reference voltage and a dither signal is amplified, and a second amplifier that amplifies a difference between the first amplified signal and the other of the dither signal and the reference voltage and outputs the amplified difference as the first feedback signal, and the second digital amplifier includes a second pulse width adjustment circuit that adjusts a pulse width of the second digital signal, a second switching circuit that amplifies an output signal from the second pulse width adjustment circuit, and a second feedback signal generation unit that generates a second feedback signal based on an output signal from the second switching circuit, the second pulse width adjustment circuit adjusts the pulse width of the second digital signal with reference to the second feedback signal, and the second feedback signal generation unit includes a third amplifier that outputs a third amplified signal in which a difference between the output signal from the second switching circuit and one of the reference voltage and the dither signal is amplified, and a fourth amplifier that amplifies a difference between the third amplified signal and the other of the dither signal and the reference voltage and outputs the amplified difference as the second feedback signal.

Advantageous Effects of Disclosure

According to an aspect of the disclosure, it is possible to achieve a digital amplifier that minimizes and restricts an analog signal system and uses a feedback signal and a dither signal.

DESCRIPTION OF EMBODIMENTS

Embodiment 1

An embodiment of the disclosure will be described below in detail.

(Digital Audio Reproduction System 1000)

Figure 1:
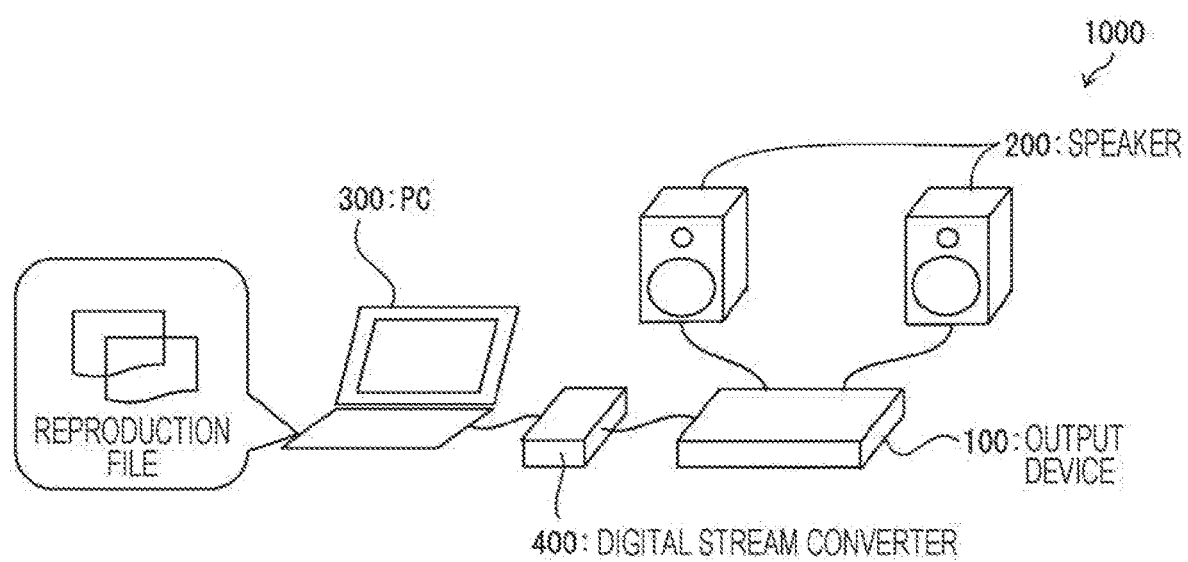
FIG. 1 is a conceptual view of a digital audio reproduction system including an output device according to Embodiment 1 of the disclosure.

FIG. 1 is a conceptual view of a digital audio reproduction system 1000 including an output device 100 according to the embodiment of the disclosure. As illustrated in FIG. 1, the digital audio reproduction system 1000 includes the output device 100, a speaker 200, a personal computer (PC) 300, and a digital stream converter 400 that are described below.

The PC 300 outputs reproduction data of a reproduction file as a coded serial digital signal.

The digital stream converter 400 outputs, to the output device 100, a direct stream digital (DSD) signal that is obtained by converting the coded serial digital signal acquired from the PC 300 into a digital signal by a DSD conversion method.

The output device 100 amplifies the acquired digital signal and outputs the amplified signal to the speaker 200.

The speaker 200 outputs sound on the basis of the signal output from the output device 100.

In this manner, in the digital audio reproduction system 1000, the reproduction data of the reproduction file reproduced in the PC 300 is able to be output from the speaker 200.

(Output Device 100)

Figure 2:
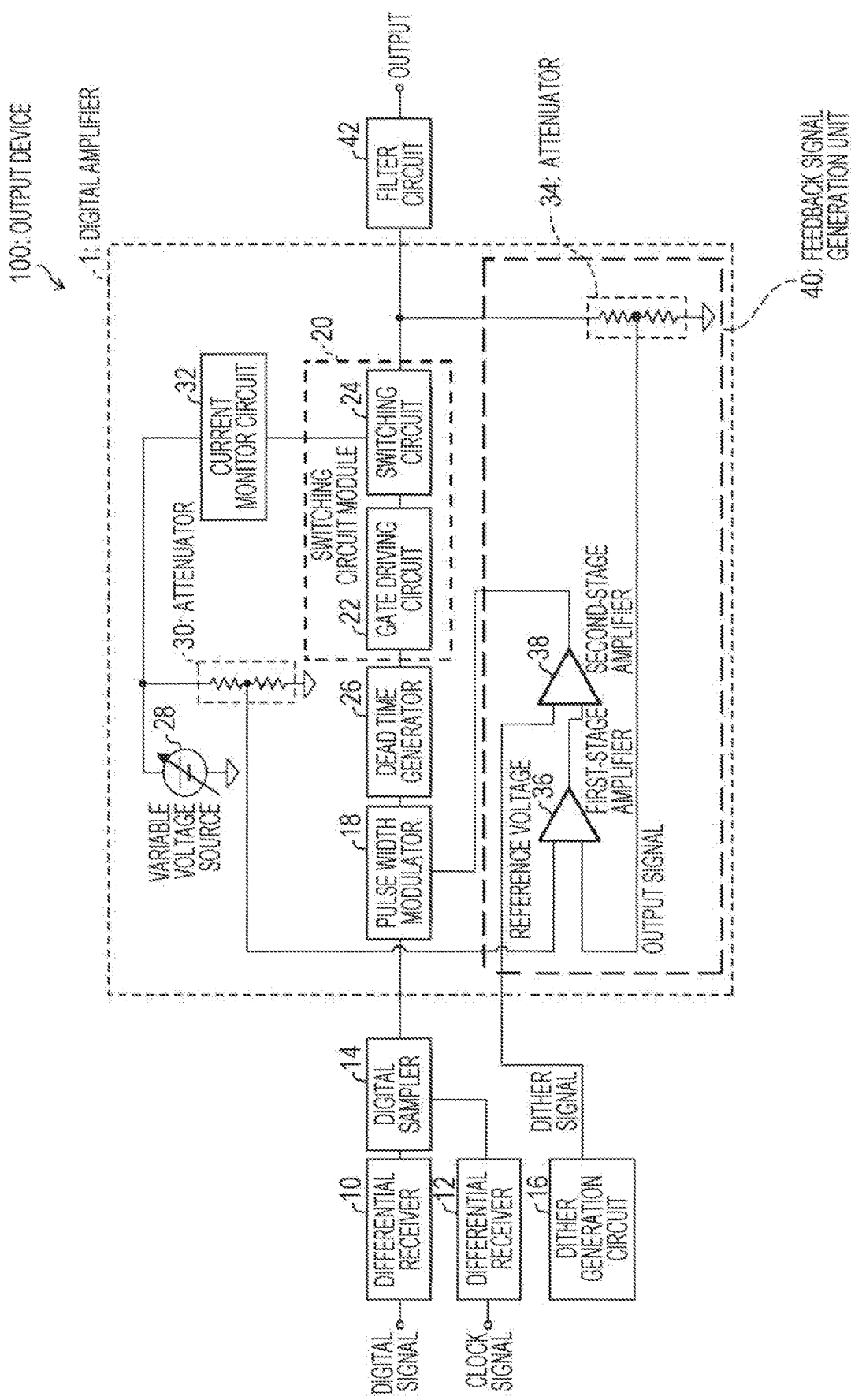
FIG. 2 is a block diagram illustrating a configuration of a main part of the output device according to Embodiment 1 of the disclosure.

FIG. 2 is a block diagram illustrating a configuration of a main part of the output device 100 according to the embodiment of the disclosure. As illustrated in FIG. 2, the output device 100 includes differential receivers 10 and 12, a digital sampler 14, a dither generation circuit (dither signal generation circuit) 16, a digital amplifier 1, and a filter circuit 42.

Digital signals of input signals are input to the differential receiver 10 by two signal lines, and the differential receiver 10 outputs a digital signal in accordance with a difference between the two signal lines.

Clock signals are input to the differential receiver 12 by two signal lines and the differential receiver 12 outputs a clock signal in accordance with a difference between the two signal lines.

The digital signal output from the differential receiver 10 and the clock signal output from the differential receiver 12 are input to the digital sampler 14 and the digital sampler 14 performs digital sampling according to the digital signal and the clock signal.

The dither generation circuit 16 outputs a dither signal for suppressing noise of the signal output from the digital amplifier 1. The dither generation circuit 16 outputs a triangular wave or white noise. Moreover, a frequency of the dither signal output from the dither generation circuit 16 is a frequency other than an integer multiple of a sampling frequency of the digital signal input from the digital amplifier 1.

(Digital Amplifier 1)

The digital signal output from the digital sampler 14 is input to the digital amplifier 1 as an input signal. The digital amplifier 1 outputs, to the filter circuit 42, a digital signal obtained by amplifying the input digital signal.

The digital amplifier 1 includes a pulse width modulator (pulse width adjustment circuit) 18, a switching circuit module 20, a dead time generator 26, a variable voltage source 28, an attenuator 30, a current monitor circuit 32, and a feedback signal generation unit 40.

The pulse width modulator 18 adjusts a pulse width of the digital signal output from the digital sampler 14 and outputs the adjusted digital signal to the switching circuit module 20.

The switching circuit module 20 includes a gate driving circuit 22 and a switching circuit 24. The switching circuit module 20 amplifies, in accordance with a power supply voltage output from the variable voltage source 28, a voltage of the digital signal output from the pulse width modulator 18 and outputs the amplified digital signal.

The dead time generator 26 generates dead time for adjusting timing at which the switching circuit 24 is driven.

The variable voltage source 28 is a voltage source for providing a power supply voltage, used for the switching circuit module 20 to amplify the voltage, and a reference voltage described later. The output voltage of the switching circuit module 20 is adjusted by adjusting the variable voltage source 28.

The attenuator 30 is an attenuator that adjusts the reference voltage.

The current monitor circuit 32 is a protection circuit and monitors current flowing into the switching circuit 24.

The feedback signal generation unit 40 generates a feedback signal on the basis of the output signal from the switching circuit module 20, the dither signal, and the reference voltage and outputs the feedback signal to the pulse width modulator 18. The feedback signal generation unit 40 includes an attenuator 34, a first-stage amplifier 36, and a second-stage amplifier 38, as illustrated in FIG. 2. The feedback signal generation unit 40 feeds back, to the pulse width modulator 18 by two-stage error amplifiers, three signals of the output signal from the switching circuit module 20, the power supply voltage from the variable voltage source 28, and the dither signal output from the dither generation circuit 16. In other words, the feedback signal generation unit 40 feeds back a pulse width adjustment signal to the pulse width modulator 18 in accordance with three parameters of the output signal, the power supply voltage, and the dither signal. The pulse width modulator 18 adjusts a pulse width of the digital signal with reference to the feedback signal.

The attenuator 34 outputs an output signal obtained by attenuating the output from the switching circuit module 20.

The first-stage amplifier 36 outputs a first amplified signal in which a difference between the output signal from the attenuator 34 and the reference voltage from the variable voltage source 28 is amplified. The feedback by the first-stage amplifier 36 makes it possible to suppress distortion of the output signal from the switching circuit module 20, which is caused by a load variation in the power supply voltage output from the variable voltage source 28. Further, the first-stage amplifier 36 is able to suppress a direct current component of the output signal and thus contributes to noise reduction. In addition, since the output of the first-stage amplifier 36 improves responsiveness to the voltage variation, damping characteristics of the output signal increase. The first-stage amplifier 36 contributes to reduction of analog noise caused by the variation in the power supply voltage and digital noise caused by generation of the dead time, which are generated in a circuit of the digital amplifier 1.

The second-stage amplifier 38 amplifies a difference between the dither signal from the dither generation circuit 16 and the first amplified signal and outputs the amplified difference as a feedback signal to the pulse width modulator 18. The second-stage amplifier 38 contributes to reduction of noise which is caused by a quantization error of the digital signal due to the dither signal. In a case where the dither generation circuit 16 outputs a signal of a triangular wave with a certain inclination, the second-stage amplifier 38 is able to collapse frequency distribution of noise that does not have periodicity like white noise and diffuse noise components. Here, the frequency of the triangular wave output from the dither generation circuit 16 is desired to avoid an integer multiple of a sampling frequency in order to prevent beat interference.

(Selection of Dither Signal)

As described above, by inputting a dither signal to an amplifier in a feedback loop, noise is able to be suppressed. The input of the dither signal is effective for reduction of noise caused by a quantization error of a digital signal.

In a case where the noise caused by the quantization error has a frequency component in an audible band, the noise results in a source of disturbing noise. The input of the dither signal enables to weaken periodicity of the noise. For example, an input of a signal of a triangular wave outside the audible band is effective for suppression of noise having a random frequency component. Moreover, when a signal that monotonously changes is input to random noise, a frequency of the noise is able to be collapsed, thus making it possible to disperse the noise. On the other hand, an input of white noise having various frequency components is effective for suppression of pink noise having a certain periodicity. Since the white noise is able to collapse the periodicity of the pink noise, influence of the noise is able to be suppressed.

(Selection of Feedback Target Frequency)

At least one of the first-stage amplifier 36 and the second-stage amplifier 38 is able to function as a filter. In addition, in view of Example 2 described later, frequency characteristics of at least one of the first-stage amplifier 36 and the second-stage amplifier 38 functioning as a filter are changed to suppress only specific noise.

Figure 3:
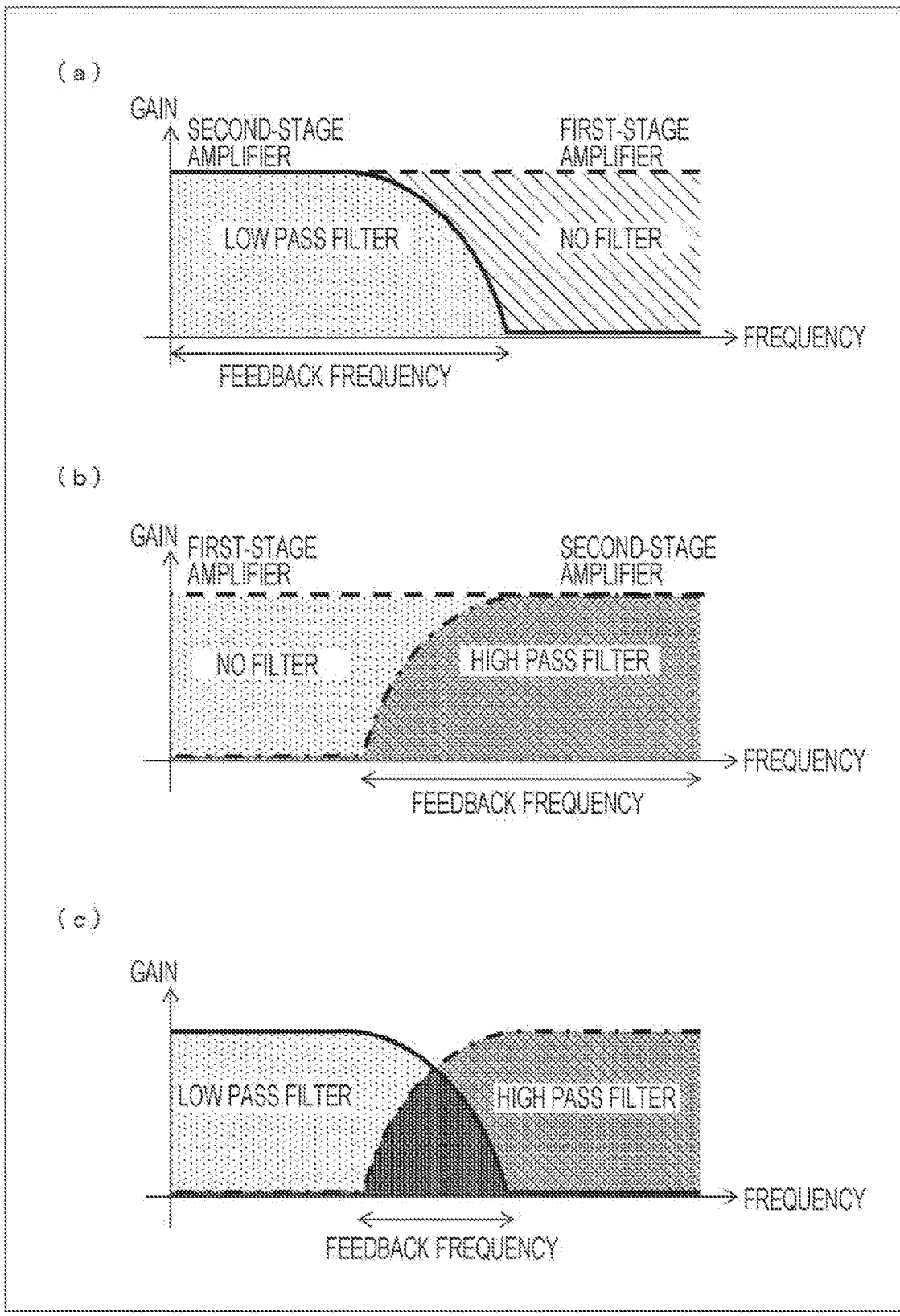
FIG. 3 illustrates frequency characteristics of a filter of the output device according to Embodiment 1 of the disclosure.

With reference to FIG. 3, an advantageous effect when the first-stage amplifier 36 and/or the second-stage amplifier 38 function as filters will be described.

In a case of pink noise having a noise component near a low frequency, at least one of the first-stage amplifier 36 and the second-stage amplifier 38 functions as a low pass filter, so that feedback is able to be applied only to a low-frequency region. FIG. 3(a) illustrates an example of a filter when feedback is set to the low-frequency region. In a case where there is noise having periodicity in a low-frequency band, the first-stage amplifier 36 does not function as a filter, but the second-stage amplifier 38 functions as a low pass filter. This makes it possible to set feedback only to a region having a relatively low frequency and remove a noise component with a low frequency. Note that, it is sufficient that at least one of the first-stage amplifier 36 and the second-stage amplifier functions as the low pass filter, and it is also possible that the first-stage amplifier 36 functions as the low pass filter and the second-stage amplifier 38 does not function as a filter. Further, both of the first-stage amplifier 36 and the second-stage amplifier 38 may function as low pass filters.

FIG. 3(b) illustrates an example of a filter when feedback is set to a high-frequency region. In a case where there is noise having periodicity in a high-frequency band, the first-stage amplifier 36 does not function as a filter, but the second-stage amplifier 38 functions as the high pass filter. This makes it possible to set feedback only to a region having a relatively high frequency and remove a noise component with a low frequency. Note that, it is sufficient that at least one of the first-stage amplifier 36 and the second-stage amplifier 38 functions as the high pass filter, and it is also possible that the first-stage amplifier 36 functions as the high pass filter and the second-stage amplifier 38 does not function as a filter. Further, both of the first-stage amplifier 36 and the second-stage amplifier 38 may function as high pass filters.

FIG. 3(c) illustrates an example of a filter when feedback is set to a region in a specific frequency. In a case where there is noise having periodicity in a specific frequency band, the first-stage amplifier 36 functions as the low pass filter and the second-stage amplifier 38 functions as the high pass filter. This makes it possible to set feedback only to the region having the specific frequency as a band pass filter and enables removal of a specific noise component. Note that, it is sufficient that one of the first-stage amplifier 36 and the second-stage amplifier 38 functions as the low pass filter and the other functions as the high pass filter, and it is also possible that the first-stage amplifier 36 functions as the high pass filter and the second-stage amplifier 38 functions as the low pass filter.

In this manner, when an amplifier functions as a filter, it is possible to increase a degree of freedom in feedback.

(Selection of Gain)

In addition, gains of the first-stage amplifier 36 and the second-stage amplifier 38 are able to be changed.

Note that, though the reference voltage is input to the first-stage amplifier 36 and the dither signal is input to the second-stage amplifier 38 in FIG. 2, the configuration is not limited thereto. That is, the dither signal may be input to the first-stage amplifier 36 and the reference voltage may be input to the second-stage amplifier 38. In this case, the first-stage amplifier 36 outputs a first amplified signal in which a difference between the output signal from the switching circuit 24 and the dither signal is amplified, and the second-stage amplifier 38 amplifies a difference between the first amplified signal and the reference voltage and outputs the amplified difference as a feedback signal what is, the first-stage amplifier 36 may output a first amplified signal in which a difference between the output signal from the switching circuit module 20 and one of the reference voltage and the dither signal is amplified. Further, the second-stage amplifier 38 may amplify a difference between the first amplified signal and the other of the dither signal and the reference voltage and output the amplified difference as a feedback signal.

The filter circuit 42 is constituted by an inductor and a capacitor and extracts a desired frequency component.

When the digital amplifier 1 is connected to the filter circuit 42, the digital amplifier 1 is able to amplify an audio signal that is input and output the resultant as a digital signal used for driving the speaker 200.

Embodiment 2

Embodiment 2 of the disclosure will be described below. Note that, for convenience of description, a member having the same function as that of the member described in the aforementioned embodiment will be given the same reference sign and description thereof will be omitted.

(BTL Connection)

Figure 4:
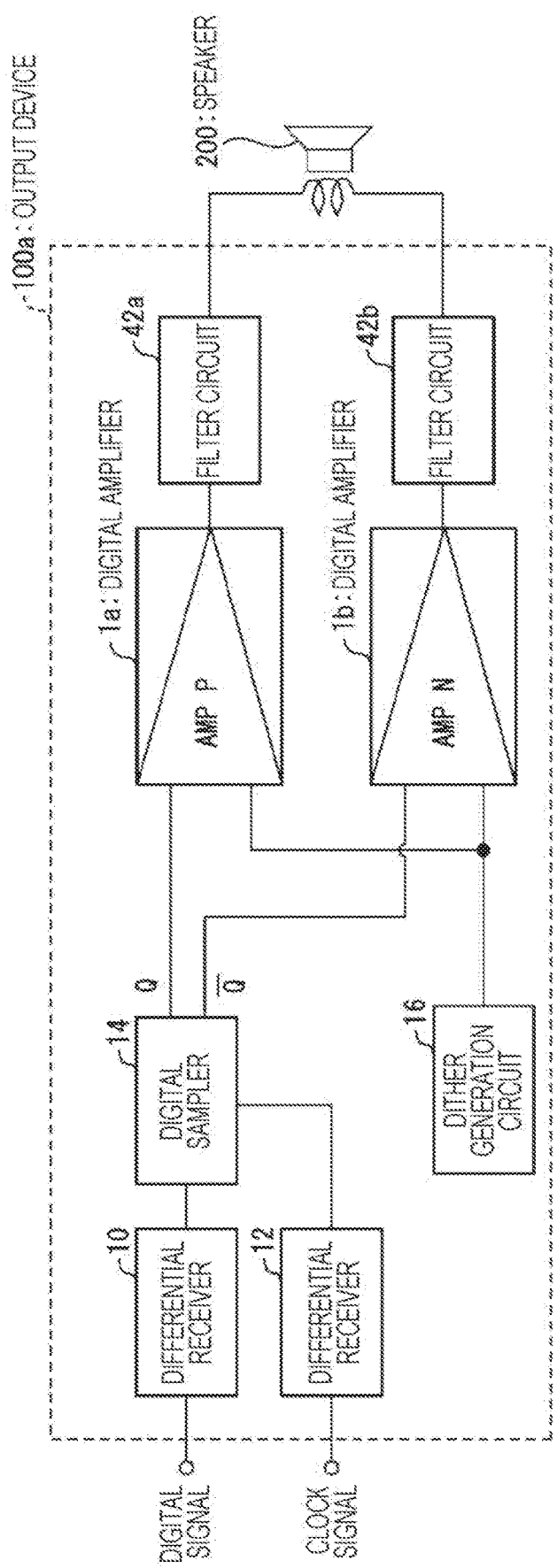
FIG. 4 is a block diagram of an output device according to Embodiment 2 of the disclosure, in which digital amplifiers are connected by Bricked Transformer less (BTL) connection or bridge connection.

A case where an output device is achieved by performing BTL connection with use of two digital amplifiers will be described with reference to FIG. 4. FIG. 4 is a block diagram of an output device 100a in which the digital amplifiers 1 according to Embodiment 1 of the disclosure are connected by BTL.

As illustrated in FIG. 4, the output device 100a includes the differential receivers 10 and 12, the digital sampler 14, the dither generation circuit 16, a digital amplifier (first digital amplifier) 1a that amplifies a first digital signal, a filter circuit 42a, a digital amplifier (second digital amplifier) 1b that amplifies a second digital signal having a phase opposite to that of the first digital signal, and a filter circuit 42b.

As illustrated in FIG. 4, in the output device 100a, an output of the digital sampler 14 and an output of the dither generation circuit 16 are input to the respective digital amplifier 1a and digital amplifier 1b. The filter circuit 42a is connected to the digital amplifier 1a on an output side. The filter circuit 42b is connected to the digital amplifier 1b on the output side. The speaker 200 (load) is connected to the filter circuit 42a and the filter circuit 42b on the output side. The output device 100a is able to cause the speaker 200 to output sound by amplifying an audio signal that is an input digital signal.

The digital sampler 14 uses a flip flop and outputs a first digital signal (Q) and a second digital signal (signal having a phase opposite to that of Q). The first digital signal (Q) is output to the digital amplifier 1a and the second digital signal (signal having the phase opposite to that of Q) is output to the digital amplifier 1b. For example, the digital sampler 14 is able to output a positive-phase signal to the digital amplifier 1a and output, to the digital amplifier 1b, a signal having a phase opposite to that of the signal output to the digital amplifier 1a. With such a configuration, DC components of the output signals of the digital amplifier 1a and the digital amplifier 1b are able to be canceled out.

The dither generation circuit 16 outputs signals in phase to the digital amplifier 1a and the digital amplifier 1b. With such a configuration, dither signals of the digital amplifier 1a and the digital amplifier 1b are also able to be canceled out by output.

In this manner, in the output device 100a according to the present embodiment, the digital amplifier 1a and the digital amplifier 1b are connected by BTL. Thus, the output device 100a is able to achieve a digital amplifier whose output voltage is doubled.

Example 1

(Full Digital Amplifier using DSD Signal as Sound Source)

In a case where a full digital amplifier that amplifies a DSD signal as a digital signal is designed, there is a problem that digital noise that is not included in an original DSD signal sound source is generated. For the digital noise, by applying a DC voltage for the purpose of suppressing an offset voltage of an output, a DC, dither signal is input to operate feedback. As a result of the operation, the input of the DC dither signal contributes to suppression of an offset voltage of an output and noise of an output signal is suppressed.

In the present example, though the DC dither signal is input as the dither signal, by inputting a signal of a triangular wave or white noise, it is expected to improve output characteristics of the digital amplifier.

Example 2

(Filter Function of Amplifier)

Moreover, as a result of analyzing digital noise that is not included in an original DSD signal sound source, it is found that the digital noise has a low frequency of 30 Hz or less. In accordance with the low frequency, when a high pass filter of 30 Hz is applied to a sound output, not only digital noise but also an output signal is affected, so that the high pass filter is not suitable.

On the other hand, in the case where digital noise has a low frequency of 30 Hz or less, a low pass filter having a cutoff frequency of 30 Hz is applied to an amplifier. In this case, feedback is able to be set to only an offset voltage having a component of 30 Hz or less, which causes noise, and noise is able to be removed without affecting an output signal.

[Conclusion]

A digital amplifier 1, 1a, 1b according to an aspect 1 of the disclosure includes: a pulse width adjustment circuit (pulse width modulator 18) that adjusts a pulse width of a digital signal; a switching circuit 24 that amplifies an output signal from the pulse width adjustment circuit (pulse width modulator 18); and a feedback signal generation unit 40 that generates a feedback signal based on an output signal from the switching circuit 24, in which the pulse width adjustment circuit (pulse width modulator 18) adjusts the pulse width of the digital signal with reference to the feedback signal, and the feedback signal generation unit 40 includes a first amplifier (first-stage amplifier 36) that outputs a first amplified signal in which a difference between the output signal from the switching circuit 24 and one of a reference voltage and a dither signal is amplified, and a second amplifier (second-stage amplifier 38) that amplifies a difference between the first amplified signal and the other of the dither signal and the reference voltage and outputs the amplified difference as the feedback signal.

According to the aforementioned configuration, a digital amplifier that minimizes and restricts an analog signal system and uses a feedback signal and a dither signal is able to be achieved.

In the digital amplifier 1, 1a, 1b according to an aspect 2 of the disclosure, the first amplifier (first-stage amplifier 36) may output a first amplified signal in which a difference between the output signal from the switching circuit 24 and the reference voltage is amplified, and the second amplifier (second-stage amplifier 38) may amplify a difference between the first amplified signal and the dither signal and output the amplified difference as the feedback signal, in the aspect 1.

According to the aforementioned configuration, it is possible to appropriately feedback an input digital signal and to appropriately remove noise in the output signal from the switching circuit. Moreover, when frequency characteristics of the first amplifier are in an audible frequency band (to 20 kHz) and frequency characteristics of the second amplifier to which the dither signal is input are in a band of the frequency (band wider than that of the audible frequency) though which the dither signal is able to sufficiently pass, it is expected to further reduce noise.

The digital amplifier 1, 1a, 1b according to an aspect 3 of the disclosure may further include a dither signal generation circuit (dither generation circuit 16) that generates the dither signal, in which the dither signal generation circuit (dither generation circuit 16) may output a triangular wave or white noise, in the aspect 1 or 2.

According to the aforementioned configuration, signals that have different characteristics are able to be output in accordance with noise.

In the digital amplifier 1, 1a, 1b according to an aspect 4 of the disclosure, a frequency of the dither signal may be a frequency other than an integer multiple of a sampling frequency of the digital signal, in any of the aspects 1 to 3.

According to the aforementioned configuration, beat interference is able to be prevented.

In the digital amplifier 1, 1a, 1b according to an aspect 5 of the disclosure, at least one of the first amplifier (first-stage amplifier 36) and the second amplifier (second-stage amplifier 38) may function as a filter, in any of the aspects 1 to 4.

According to the aforementioned configuration, feedback is able to be set only to a region in a specific frequency.

In the digital amplifier 1, 1a, 1b according to an aspect 6 of the disclosure, the first amplifier (first-stage amplifier 36) and the second amplifier (second-stage amplifier 38) may function as low pass filters, in any of the aspects 1 to 5.

According to the aforementioned configuration, it is possible to set feedback only to a region having a relatively low frequency and remove a noise component with a low frequency.

In the digital amplifier 1, 1a, 1b according to an aspect 7 of the disclosure, the first amplifier (first-stage amplifier 36) and the second amplifier (second-stage amplifier 38) may function as high pass filters, in any of the aspects 1 to 5.

According to the aforementioned configuration, it is possible to set feedback only to a region having a relatively high frequency and remove a noise component with a low frequency.

In the digital amplifier 1, 1a, 1b according to an aspect 8 of the disclosure, one of the first amplifier (first-stage amplifier 36) and the second amplifier (second-stage amplifier 38) may function as a low pass filter and the other may function as a high pass filter, in any of the aspects 1 to 5.

According to the aforementioned configuration, it is possible to set feedback only to a region having a specific frequency and remove a specific noise component.

An output device 100a according to an aspect 9 of the disclosure includes: a first digital amplifier (digital amplifier 1a) that amplifies a first digital signal; and a second digital amplifier (digital amplifier 1b) that amplifies a second digital signal having a phase opposite to a phase of the first digital signal, in which the first digital amplifier (digital amplifier 1a) includes a first pulse width adjustment circuit (pulse width modulator 18) that adjusts a pulse width of the first digital signal, a first switching circuit (switching circuit 24) that amplifies an output signal from the first pulse width adjustment circuit (pulse width modulator 18), and a first feedback signal generation unit (feedback signal generation unit 40) that generates a first feedback signal based on an output signal from the first switching circuit (switching circuit 24), the first pulse width adjustment circuit (pulse width modulator 18) adjusts the pulse width of the first digital signal with reference to the first feedback signal, and the first feedback signal generation unit (feedback signal generation unit 40) includes a first amplifier (first-stage amplifier 36) that outputs a first amplified signal in which a difference between the output signal from the first switching circuit (switching circuit 24) and one of a reference voltage and a dither signal is amplified, and a second amplifier (second-stage amplifier 38) that amplifies a difference between the first amplified signal and the other of the dither signal and the reference voltage and outputs the amplified difference as the first feedback signal, and the second digital amplifier (digital amplifier 1b) includes a second pulse width adjustment circuit (pulse width modulator 18) that adjusts a pulse width of the second digital signal, a second switching circuit (switching circuit 24) that amplifies an output signal from the second pulse width adjustment circuit (pulse width modulator 18), and a second feedback signal generation unit (feedback signal generation unit 40) that generates a second feedback signal based on an output signal from the second switching circuit (switching circuit 24), the second pulse width adjustment circuit (pulse width modulator 18) adjusts the pulse width of the second digital signal with reference to the second feedback signal, and the second feedback signal generation unit (feedback signal generation unit 40) includes a third amplifier (first-stage amplifier 36) that outputs a third amplified signal in which a difference between the output signal from the second switching circuit (switching circuit 24) and one of the reference voltage and the dither signal is amplified, and a fourth amplifier (second-stage amplifier 38) that amplifies a difference between the third amplified signal and the other of the dither signal and the reference voltage and outputs the amplified difference as the second feedback signal.

According to the aforementioned configuration, the output device 100a is able to achieve a digital amplifier whose output voltage is doubled.

The disclosure is not limited to each of the embodiments described above, and may be modified in various manners within the scope indicated in the claims and an embodiment achieved by appropriately combining technical means disclosed in different embodiments is also encompassed in the technical scope of the disclosure. Further, by combining the technical means disclosed in each of the embodiments, a new technical feature may be formed.

The invention claimed is:

1. A digital amplifier comprising:
a pulse width adjustment circuit that adjusts a pulse width of a digital signal;
a switching circuit that amplifies an output signal from the pulse width adjustment circuit; and
a feedback signal generation unit that generates a feedback signal based on an output signal from the switching circuit, wherein
the pulse width adjustment circuit adjusts the pulse width of the digital signal with reference to the feedback signal, and
the feedback signal generation unit includes
a first amplifier that outputs a first amplified signal in which a difference between the output signal from the switching circuit and one of a reference voltage and a dither signal is amplified, and
a second amplifier that amplifies a difference between the first amplified signal and another of the dither signal and the reference voltage and outputs the amplified difference as the feedback signal.

2. The digital amplifier according to claim 1, wherein
the first amplifier outputs a first amplified signal in which a difference between the output signal from the switching circuit and the reference voltage is amplified, and
the second amplifier amplifies a difference between the first amplified signal and the dither signal and outputs the amplified difference as the feedback signal.

3. The digital amplifier according to claim 2, further comprising
a dither signal generation circuit that generates the dither signal, wherein the dither signal generation circuit outputs a triangular wave or white noise.

4. The digital amplifier according to claim 1, wherein a frequency of the dither signal is a frequency other than an integer multiple of a sampling frequency of the digital signal.

5. The digital amplifier according to claim 1, wherein at least one of the first amplifier and the second amplifier functions as a filter.

6. The digital amplifier according to claim 1, wherein the first amplifier and the second amplifier function as low pass filters.

7. The digital amplifier according to claim 1, wherein the first amplifier and the second amplifier function as high pass filters.

8. The digital amplifier according to claim 1, wherein one of the first amplifier and the second amplifier functions as a low pass filter and another of the first amplifier and the second amplifier functions as a high pass filter.

9. An output device comprising:
a first digital amplifier that amplifies a first digital signal; and
a second digital amplifier that amplifies a second digital signal having a phase opposite to a phase of the first digital signal, wherein
the first digital amplifier includes
a first pulse width adjustment circuit that adjusts a pulse width of the first digital signal,
a first switching circuit that amplifies an output signal from the first pulse width adjustment circuit, and
a first feedback signal generation unit that generates a first feedback signal based on an output signal from the first switching circuit, the first pulse width adjustment circuit adjusts the pulse width of the first digital signal with reference to the first feedback signal, and the first feedback signal generation unit includes
a first amplifier that outputs a first amplified signal in which a difference between the output signal from the first switching circuit and one of a reference voltage and a dither signal is amplified, and
a second amplifier that amplifies a difference between the first amplified signal and another of the dither signal and the reference voltage and outputs the amplified difference as the first, feedback signal, and the second digital amplifier includes
a second pulse width adjustment circuit that adjusts a pulse width of the second digital signal,
a second switching circuit that amplifies an output signal from the second pulse width adjustment circuit, and
a second feedback signal generation unit that generates a second feedback signal based on an output signal from the second switching circuit, the second pulse width adjustment circuit adjusts the pulse width of the second digital signal with reference to the second feedback signal, and the second feedback signal generation unit includes
a third amplifier that outputs a third amplified signal in which a difference between the output signal from the second switching circuit and one of the reference voltage and the dither signal is amplified, and
a fourth amplifier that amplifies a difference between the third amplified signal and another of the dither signal and the reference voltage and outputs the amplified difference as the second feedback signal.

* * * * *